United States Patent [19]
Schoen

[11] Patent Number: 4,491,313
[45] Date of Patent: Jan. 1, 1985

[54] SUCTION DEVICE FOR HOLDING PLATES

[75] Inventor: Klaus-Peter Schoen, Wiesbaden, Fed. Rep. of Germany

[73] Assignee: Hoechst Aktiengesellschaft, Frankfurt am Main, Fed. Rep. of Germany

[21] Appl. No.: 402,262

[22] Filed: Jul. 27, 1982

[30] Foreign Application Priority Data

Jul. 29, 1981 [DE] Fed. Rep. of Germany ....... 3129899
Sep. 26, 1981 [DE] Fed. Rep. of Germany ....... 3138404

[51] Int. Cl.$^3$ ..................... B65H 29/24; B65H 9/02
[52] U.S. Cl. ................................. 271/194; 271/185;
271/196; 271/227; 271/236; 271/251; 355/73;
198/689; 248/363
[58] Field of Search ............. 271/194, 195, 196, 226,
271/227, 228, 234, 236, 239, 251, 184, 185;
355/73, 76, 35 H; 198/689, 404, 456; 248/362,
363; 414/16

[56] References Cited

U.S. PATENT DOCUMENTS

| | | | |
|---|---|---|---|
| 2,519,610 | 8/1950 | Sussin | 248/363 |
| 2,572,640 | 10/1951 | Lovegrove | 248/363 |
| 3,064,524 | 11/1962 | Durst | 355/73 |
| 3,330,555 | 7/1967 | Shearer et al. | |
| 3,588,090 | 6/1971 | Huston | 271/227 |
| 3,597,078 | 8/1971 | Miyauchi | 248/363 |
| 3,908,986 | 9/1975 | Bleau | 271/251 |
| 3,921,827 | 11/1975 | Joice | 198/689 |
| 4,006,984 | 2/1977 | Friese | |
| 4,052,054 | 11/1977 | Cardwell et al. | 271/251 |
| 4,111,412 | 9/1978 | Cathers | 198/456 |
| 4,286,907 | 9/1981 | Houle et al. | 271/196 |
| 4,375,285 | 3/1983 | Dennhardt | 271/15 |
| 4,402,592 | 9/1983 | Schon et al. | 355/73 |

FOREIGN PATENT DOCUMENTS

| | | |
|---|---|---|
| 1597858 | 9/1967 | Fed. Rep. of Germany . |
| 2213532 | 3/1972 | Fed. Rep. of Germany . |
| 2462216 | 11/1974 | Fed. Rep. of Germany . |
| 566570 | 9/1975 | Switzerland . |

Primary Examiner—Bruce H. Stoner, Jr.
Assistant Examiner—James E. Barlow
Attorney, Agent, or Firm—Schwartz, Jeffery, Schwaab, Mack, Blumenthal & Koch

[57] ABSTRACT

The present invention relates to a suction device for securely holding printing plates in a processing position by sub-atmospheric pressure. The suction device comprises a turnstile arrangement with four suction tables in two mutually perpendicular planes and is connected to a motor which rotates the turnstile arrangement in 90° steps. Four suction chambers are located in a hub part of the turnstile arrangement, these chambers being connected, via pressure lines, to a vacuum source for generating sub-atmospheric pressure. The supporting surface of each suction table comprises suction slots, which communicate in pairs, each of these communicating pairs of suction slots being connected to the associated suction chamber via a common suction passage. Each suction chamber comprises a piston with its piston rod being guided outwardly through an end face of the hub part and carrying a circular plate. The inner surface of this plate bears partly against the outside surface and against the inner edge of a stationary radial cam-plate.

17 Claims, 8 Drawing Figures

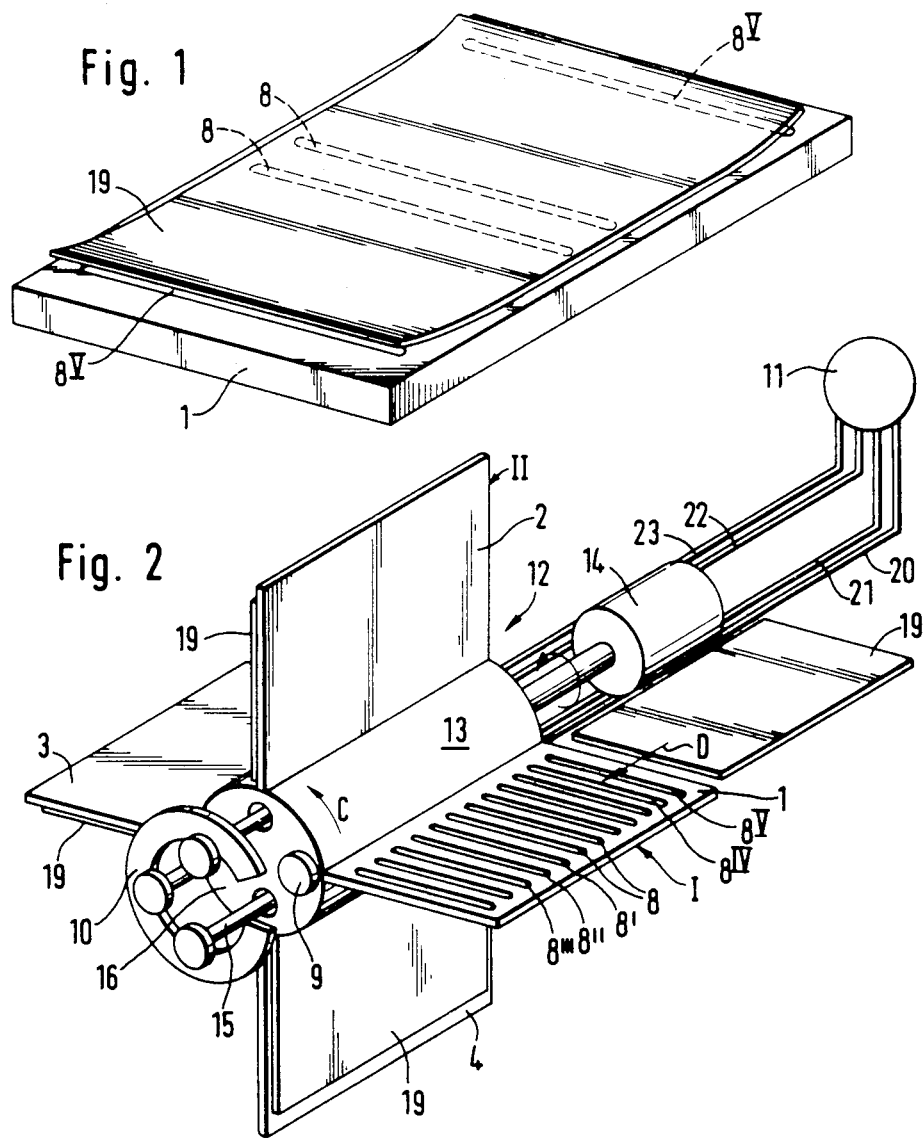

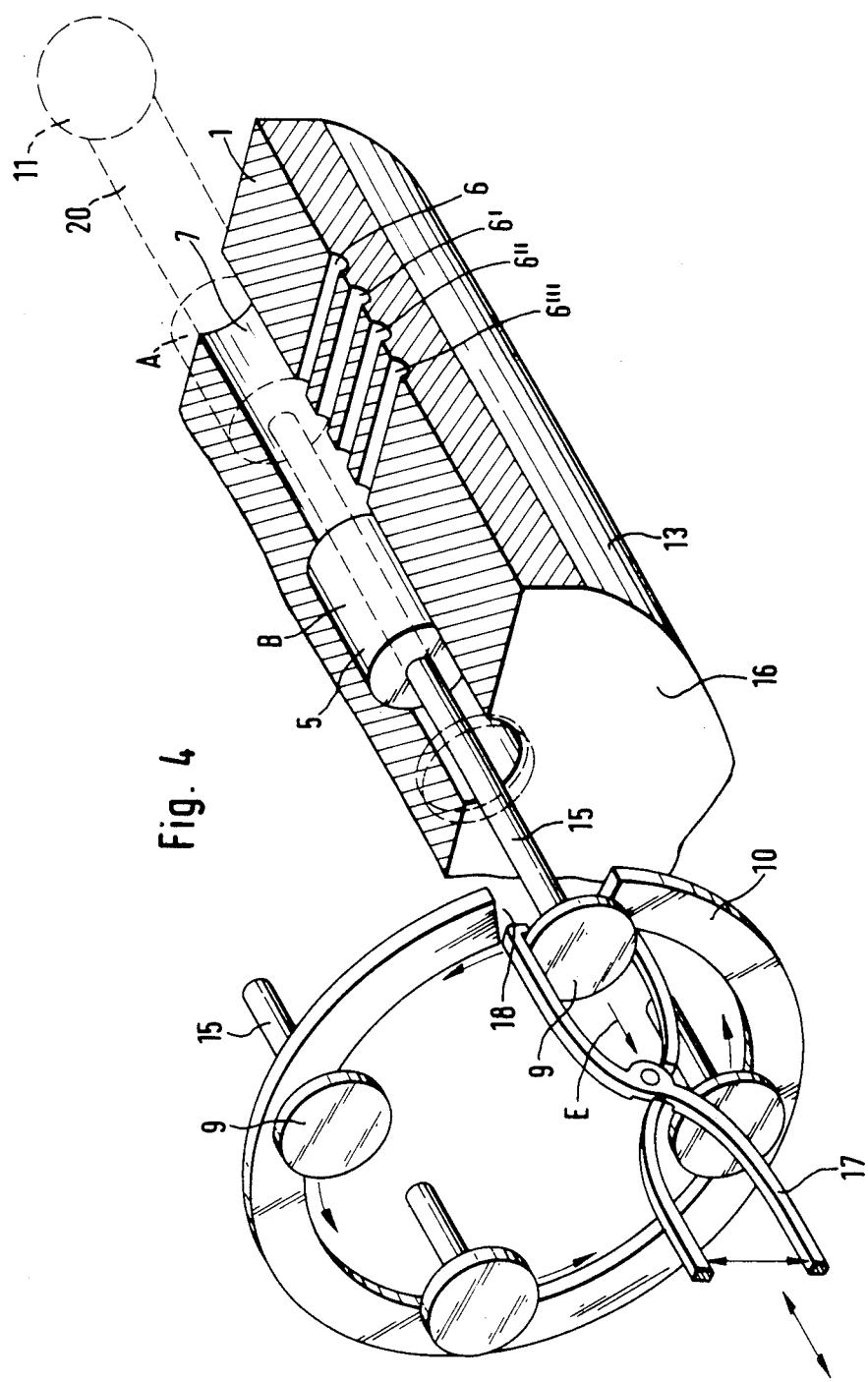

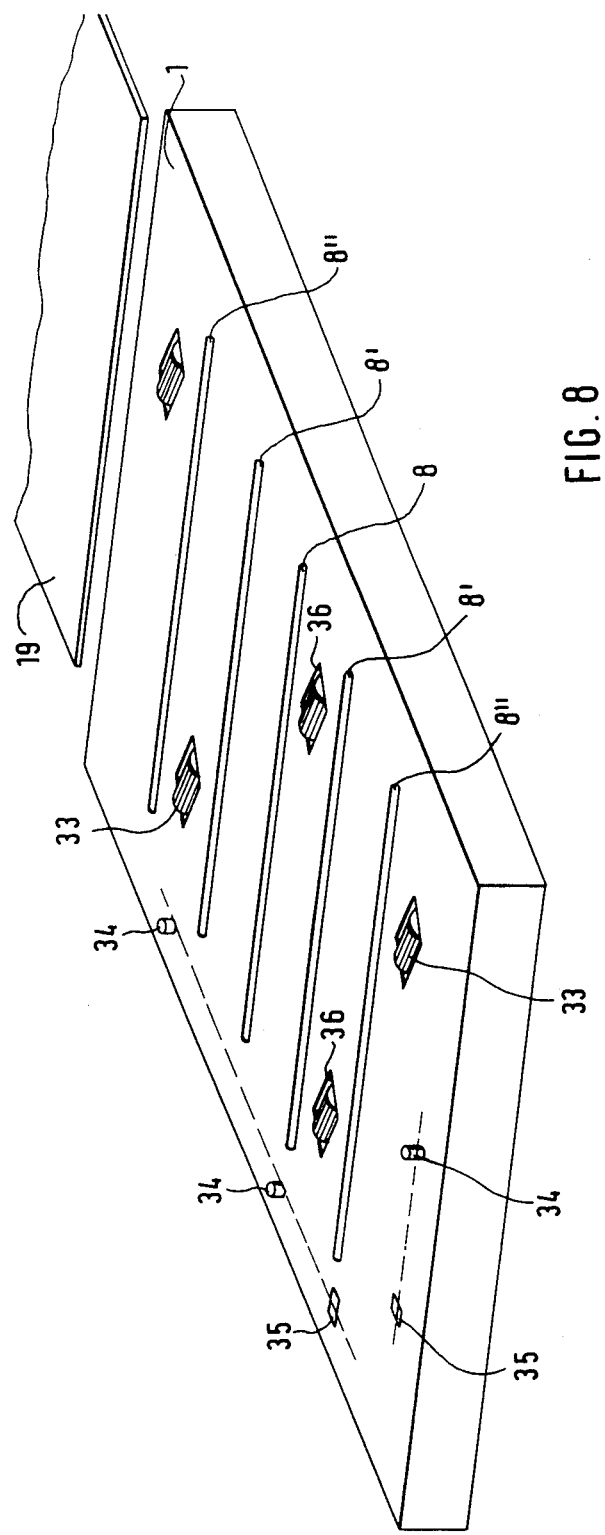

SUCTION DEVICE FOR HOLDING PLATES

BACKGROUND OF THE INVENTION

The present invention relates to a suction device for securely holding plates by sub-atmospheric pressure in a processing position, and for transporting the plates through a plurality of processing stations.

Suction devices of this type are employed in units for processing printing plates, wherein an individual printing plate is transported from a plate magazine to an exposure stage. A suction device of this type is an especially important component.

In the production of printing plates, the plates are initially charged and then exposed, imagewise, with an original which is to be copied. For this purpose, it is necessary that the printing plate lies as flat as possible in the exposure station.

An electrophotographic continuous copying machine for recording material in sheet form is described in German Auslegeschrift No. 1,597,858. This machine possesses a suction-grab device for lifting the uppermost sheet from a stack, and for feeding the sheet to a transport device. The latter comprises a transport carriage, on the underside of which a suction device, operated at sub-atmospheric pressure, is provided for holding the recording material.

In this known continuously-running machine, time is wasted in view of the fact that the recording material is lifted from the stack by a suction device which is separate from the transport device. This suction device hands over the recording material to the transport device, operated with the use of subatmospheric pressure, of the transport carriage, and the latter then further transports the recording material to the charging device, and to the processing stations which are sequentially arranged behind the charging device.

U.S. Pat. No. 3,330,555 discloses an electrophotographic copying machine, in which the copy sheets are guided to a vacuum-type suction plate.

In the printing-plate processing appliance described in German patent No. 2,462,216, the uppermost printing plate is removed from a plate magazine by a transport carriage which possesses a vacuum plate on the underside. The transport carriage is driven toward the exposure stage, and as soon as it has reached a position above the exposure stage, it is lowered onto the stage, and the sub-atmospheric pressure is removed from the vacuum plate, so that the printing plate is released and is deposited onto the exposure stage. The exposure stage is likewise equipped with a vacuum plate, to which subatmospheric pressure is applied as soon as the printing plate rests on it. The printing plate is thereby pressed securely against the exposure stage for the exposure operation. With this arrangement, it is found that the positioning of the pre-sensitized printing plates is insufficiently flat. This is brought about by the fact that these plates are generally produced from aluminum strip material which is wound on cores, whereby elastic deformations are caused in the structure of the material, which give rise to the tendency of the printing plates to roll up. As a result, the printing plate is incompletely held by suction against the vacuum plate of the exposure station, or of the developing station. This factor can give rise to lack of sharpness during the exposure and/or developing process.

In the known machines, time is wasted, above all, by the fact that a certain time is required for the printing plate to be released by the vacuum plate of the processing station in question, since the subatmospheric pressure in the vacuum plate cannot be released suddenly, but requires a definite time interval.

Additionally in the known machine, the device for transporting the printing plate must travel back to the plate magazine from the exposure station, in order to pick up another printing plate from the magazine and transport it into the exposure station. Since, in the known machines the individual stations for exposing, developing, fixing, decoating and, if appropriate, die-cutting the printing plate are constructed one behind another, the space requirement is large. In addition, transport devices, which operate, for example, by means of compressed air or electric motors, and which may be different in the same machine, are provided for the transport of the printing plates from one processing station to the next processing station. Transporting the printing plates between the individual processing stations increases the processing time of the printing plates and, in addition, the machine becomes increasingly susceptible to breakdowns, due to the employment of different transport-device systems, instead of a single transport system capable of conveying the printng plate to the various processing stations.

SUMMARY OF THE INVENTION

It is therefore an object of the present invention to provide a suction device for securely holding a printing plate and for conveying it through processing stations of a printing-plate processing machine.

Another object of the present invention is the provision of a suction device for the plate to be completely held, by suction, against the vacuum plate of a processing station, even if the positioning of the printing plate is insufficiently flat.

Yet another object is the provision of a suction device which enables the transport of the printing plate from station to station to be effected without changing the transport device.

An additional object is the provision of such a suction device which can be adapted to different plate sizes, with a small expenditure of labor.

In accomplishing the foregoing objects, there has been provided according to the present invention a suction device for securely holding plates in a processing position by sub-atmospheric pressure and for transporting the plates through a plurality of processing stations, comprising a turnstile arrangement having a plurality of suction tables, each comprising a plurality of suction slots on the surface thereof; a vacuum source; and means, including a plurality of suction chambers connected to the suction slots by means of suction passages wherein each of the suction tables has a corresponding suction chamber, for providing a sub-atmospheric pressure through the suction chambers to the suction slots in such a manner that the sub-atmospheric pressure originates with the center slots and progresses in a successive manner to the outer edge slots, in order to provide sufficient pressure to completely lay flat the plates being processed.

In a preferred embodiment, the suction slots of each of the suction tables are connected in pairs to communicate with each other, wherein the slots comprising these pairs of slots are grouped, starting with the two central slots and progressing successively outwardly, to include the slots adjacent to the next more centrally paired slots.

The following advantages are obtained as a result of the invention. First, even if it exhibits a pronounced tendency to roll up, the printing plate is drawn, starting from the center, and proceeding strip-wise in the outward direction, into a flat position by the suction table. Also, the printing plates, which are securely held on the individual suction tables, are simultaneously subjected to different processing steps. Further, a compact form of construction of the printing-plate processing machine is obtained, with very short transport paths and very short transport times from one processing station to the next processing station. Additionally, a turnstile arrangement can be quickly adapted to a new plate format, without major effort, and every printing plate can be positioned in the same position on every suction table by means of stop-pins.

Further objects, features and advantages of the present invention will become apparent from the detailed description of preferred embodiments which follows, when considered with the attached drawings.

BRIEF DESCRIPTION OF THE DRAWINGS

In the drawings:

FIG. 1 is a perspective view of a typical rolled or curled printing plate on a suction table;

FIG. 2 illustrates a first turnstile arrangement of the suction device according to the present invention;

FIG. 3 is a cross-sectional view of the turnstile arrangement according to FIG. 2;

FIG. 4 is an exploded, partially sectioned perspective view of a suction table and a hub part according to FIG. 2;

FIG. 8 is a perspective view of a suction table, with drive rollers, stop-pins, and sensors.

DETAILED DESCRIPTION OF PREFERRED EMBODIMENTS

Figure 5:
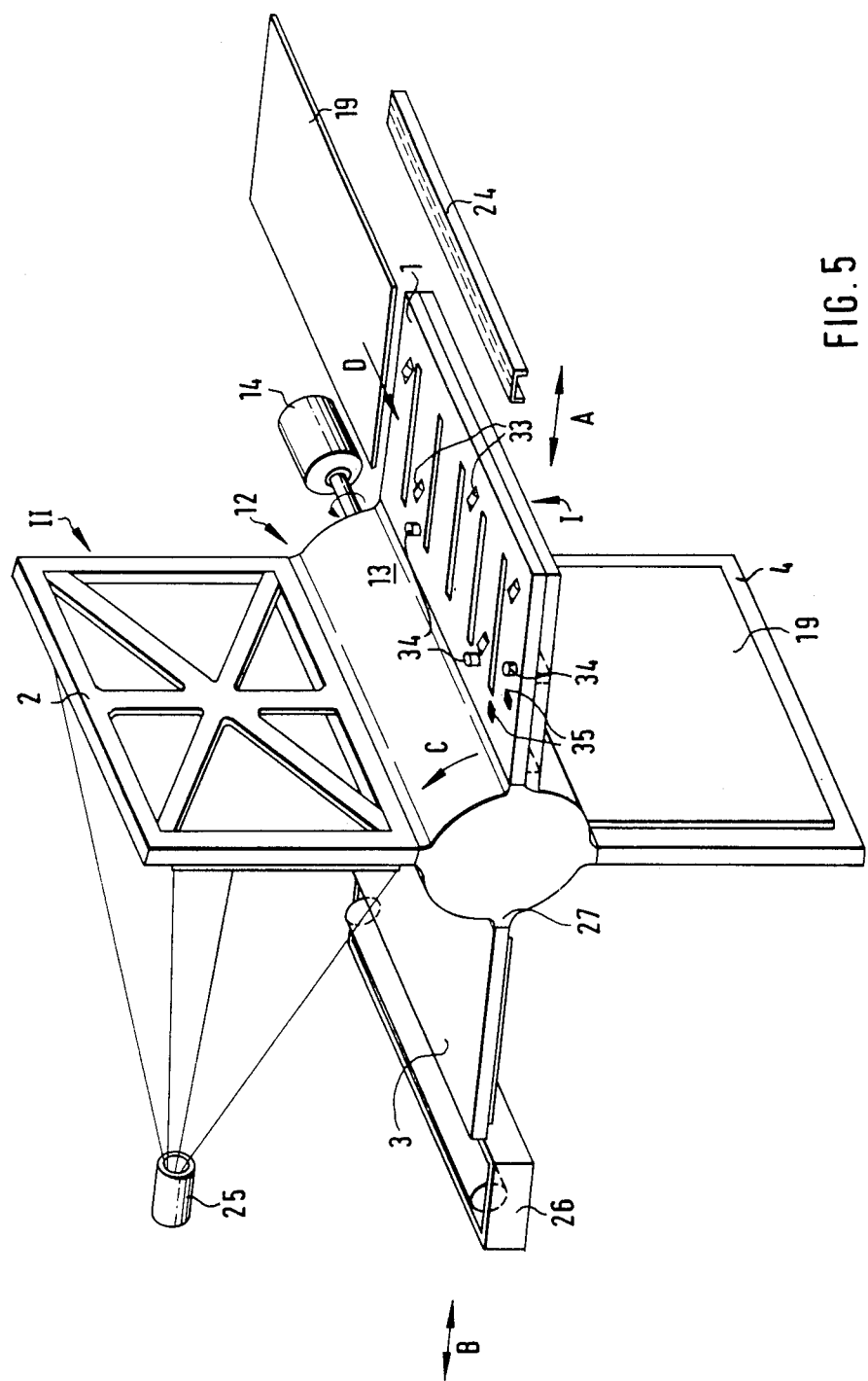
FIG. 5 illustrates a second turnstile arrangement of the suction device according to the present invention.

In FIG. 1, a suction plate of a suction table 1 is represented diagrammatically and in perspective. This plate has suction slots $8,8 \ldots 8^V,8^V$ in its surface. Only the suction slots 8,8 located in the center of the suction plate and $8^V$ located at the far edge of the table, are represented, by broken lines, whereas suction slot $8^V$, located at the near edge of the table, is completely visible due to the curled nature of the edges of the printing plate resting on the suction plate. For the sake of better clarity, the suction slots located between the slots 8 and $8^V$ are omitted. A heavily bent or curled printing plate 19 rests on the suction table 1, the sides of this plate being raised in the vicinity of the suction slots $8^V,8^V$. As soon as a sub-atmospheric pressure is applied to the suction slots $8,8 \ldots 8^V,8^V$, the suction slots are poorly covered, at least near the edges of the printing plate 19, due to the fact that the printing plate tends to roll up, and this prevents the building up of suction, so that the printing plate does not assume a flat position on the suction table 1. When the positioning is faulty with regard to flatness, it is obvious that the image of an original to be copied, which is projected onto the printing plate 19, suffers distortions at its edges. These distortions then also appear in the prints produced by means of a printing plate of this type.

The essential component of the suction device shown in FIG. 2 is a turnstile arrangement 12, comprising four suction tables 1, 2, 3, 4, located in pairs, in two mutually perpendicular planes I, II. The suction tables 1 and 3 are located in the plane I, and the suction tables 2 and 4 are located in the plane II. The core piece of the turnstile arrangement 12 is a central hub part 13, with the individual suction tables extending outwardly from its peripheral surface.

The turnstile arrangement 12 is driven by a motor 14 which rotates the turnstile arrangement 12 in 90° steps.

A number of suction slots $8,8; 8',8'; \ldots 8^V,8^V$ are present in the surface of each suction table 1, 2, 3, 4. It is possible to apply sub-atmospheric pressure, from a vacuum source 11, to these suction slots. The application of vacuum occurs successively from the center of the suction table in question, to its edges. Starting from the center of the suction table, the suction slots in the upper surface or supporting surface of the individual suction table are connected to the edges in pairs. This will be described in more detail below. By this means, the printing plate 19, which rests on the suction table, is drawn by suction into contact in a strip-wise manner, proceeding outwardly from the center.

As can be seen from the sectional representation in FIG. 3, the suction slots $8,8; 8',8', 8'',8''; \ldots$ are connected to the vacuum source 11 via suction passages 6; $6'; 6''; \ldots$ and a suction chamber 7.

The suction slots in the surface of the individual suction table 1, 2, 3, 4 are connected together, in pairs, in a manner such that the two central suction slots 8,8 in the supporting surface communicate with each other, and are connected to the suction chamber 7 via the common suction passage 6. The two suction slots 8',8', which are located to the right and to the left of the suction slots 8,8, similarly communicate with each other, in pairs. This trend continues with the two suction slots 8'',8'', which are adjacent to the slots 8'',8'', and the remaining suction slots which are adjacent thereto. The suction slots 8',8' are connected to the suction chamber 7 via the common suction passage 6', and the suction slots 8'',8'' are connected to the suction chamber 7 via the common suction passage 6''.

Four suction chambers 7 of this type are provided in the hub part 13, with one of these chambers being allocated, in each case, to a particular suction table. Four pressure lines 20 to 23 connect the suction chambers 7 to the vacuum source 11 (FIG. 2). In each suction chamber 7, a piston 5 is provided, which can be shifted from a starting position A, shown in FIG. 4, into a limiting position B. In FIG. 4, the starting position A of the piston 5 is represented by a broken line, while its limiting position B is drawn with solid lines. Each piston 5 carries a piston rod 15 which is led out of an end face 16 of the hub part 13. This end face 16 is located further away from the vacuum source 11 than the second end face of the hub part 13 (see FIG. 2).

In the course of its movement from the starting position A into its limiting position B, the piston 5 first of all opens the suction passage 6 of the two central slots 8,8, then opens the suction passage 6' of the suction slots 8',8', which are adjacent to these suction slots, on the left and on the right, and then successively opens the remaining suction passage 6'',6'', etc., moving outwardly from the center of the supporting surface of the suction table. The suction passages are thus successively connected to the vacuum source 11, which in turn generates the sub-atmospheric pressure. By this means, a vacuum is built up in the suction slots, in succession, beginning with the two central suction slots, and as a result of this, the printing plate 19 is drawn into contact by suction and rests flat on the surface of the suction table, which in some cases will act as a supporting surface.

As soon as the piston 5 in the suction chamber 7 of the individual suction table 1, 2, 3 or 4 has reached its limiting position B, in which all suction passages 6, 6', 6", ... of the suction table under consideration are connected to the vacuum source 11, via the suction chamber 7, the turnstile arrangement 12 rotates through an angle of 90°, in the direction of the arrow C in FIG. 2. As a result of this rotation, the suction tables 1 and 3 move from the horizontal plane I into the vertical plane II, and the suction tables 2 and 4 conversely move out of the vertical plane II into the horizontal plane I. During this rotation through 90°, the printing plates remain held by suction on the suction tables.

As can be seen from FIG. 2, a radial cam-plate 10 is located at a distance from the end face 16. In an embodiment, this cam-plate is designed, for example, as a circular ring with a cut-out 18. This radial cam-plate 10 is located at a fixed position, and can, moreover, also have a shape which differs from the shape shown. At its free end, each piston rod 15 carries a circular plate 9, and when the piston 5 is in the limiting position B, the inner surface of this plate bears partly against the outside and against the inner edge of the stationary radial camplate 10. The clearance between the radial cam-plate 10 and the end face 16 of the hub part 13 is selected such that, when the inner surface of the circular plate 9 bears against the outer surface of the radial cam-plate 10, the piston 5 opens all the suction passages 6, 6', 6" ..., thus connecting them, via the suction chambers 7, to the vacuum source 11, and admitting sub-atmospheric pressure to them from this vacuum source.

FIG. 4 correspondingly represents the position of the piston 5 and the contact between the inner surface of the circular plate 9 and the radial cam-plate 10. FIG. 4 shows, in partial section, only the suction passages 6, 6', ..., together with the piston 5 and the suction chamber 7 for a single suction table. For the sake of better clarity, the remaining three suction tables, with their suction passages and suction chambers as well as their pistons, have been omitted from FIG. 4, and their presence is indicated only by the piston rods 15 and the circular plates 9.

The shifting of the piston 5, from its starting position A into its limiting position B is effected with the aid of a grab device 17, which captures the circular plate 9 of the piston rod 15 through the cut-out 18 in the stationary radial camplate 10, and pulls the piston rod 15 in the direction of the arrow E. As soon as the piston 5 has reached its limiting position B, rotation of the turnstile arrangement 12 takes place, and as a result, the piston rod 15 which has been pulled through the cutout 18 is also rotated through 90°, so that the circular plate 9 of this piston rod comes to rest on the outside of the radial cam-plate 10. By this means, it is ensured that the piston 5 cannot travel back into its starting position A under the action of the vacuum present in the suction chamber 7, since the radial cam-plate 10 blocks movement in opposition to the movement in the direction of the arrow E.

The mode of operation of the suction device is as follows:

With the turnstile arrangement 12 in the position shown in FIG. 2, a printing plate 19, for example, is transported onto the suction table 1, in the direction of the arrow D. As soon as the printing plate 19 is positioned on the supporting surface of the suction table 1, the plate is drawn by suction into contact in the manner described above, in that the grab device 17 captures the circular plate 9 and pulls the piston 5 from its starting position A into its limiting position B. The operation of drawing the printing plate 19 into contact by suction is then ended, and the turnstile arrangement 12 is rotated through 90° by the motor 14, which is appropriately controlled so that the suction table 1, with the printing plate 19, assumes a vertical position in plane II. In this position, the exposure of the printing plate 19 is carried out by means of conventional exposure devices which are not shown. During the rotation through 90°, the suction table 4 moves out of the vertical plane II and into the horizontal plane I, where it assumes the position of the suction table 1 which has now been rotated upwardly. During the upward rotation of the suction table 4, the circular plate 9 of the piston rod 15 of the associated piston slides along against the inside of the radial camplate 10 until it has reached the cut-out 18. Since sub-atmospheric pressure is admitted to the suction table 4, the sub-atmospheric pressure draws the piston 5 in a direction opposite to the direction of the arrow E, as soon as its circular plate 9 has reached the cut-out 18, so that the circular plate 9 comes to rest against the end face 16 of the hub part 13, as represented in FIG. 2. As a result of this sudden release of the vacuum in the suction chamber 7, the printing plate 19, which is located on the suction table 4, is released and can be transported away in the direction of the arrow D. A new printing plate 19 is then pushed onto the suction table 4 in the direction D. The grab device 17 then captures the circular plate 9 and pulls it in the direction of the arrow E up to the level of the radial cam-plate 10. As a result, the newly deposited printing plate 19 is drawn by suction into contact against the suction table 4. As soon as this operation is concluded, the motor 14 once again rotates the turnstile arrangement 12 through 90°, in the direction of the arrow C. The suction table 1 is then located in the horizontal plane I, with the printing plate 19 being held by suction and pointing downwardly. In this position of the turnstile arrangement 12, the printing plate 19 is developed on the suction table 1 by means of conventional devices which are not shown. At the same time, the printing plate 19 on the suction table 4, which is located in the vertical plane II, is exposed, while a finished printing plate is transported from the suction table 3 and a new printing plate 19 is drawn to this plate by suction. Thereafter, a further 90° rotation of the turnstile arrangement 12 takes place, so that the suction table 1 comes to rest in the vertical plane II, in which the printing plate 19 is, for example, die-cut or decoated. With the next 90° rotation of the turnstile arrangement 12, the suction table 1 arrives back in its starting position, in which the vacuum is suddenly removed, so that the printing plate 19 can be released and can be transported away in the direction of the arrow D. A further printing plate 19 is pushed onto the suction table 1, and the processing cycle begins anew.

The suction device thus enables four printing plates to be processed simultaneously. In such an arrangement, each individual printing plate passes through a different process step than the remaining three printing plates after each 90° rotation of the turnstile arrangement 12. It is obvious that, by this means, a large saving of time is achieved in the processing of a comparatively large number of printing plates. The processing cycle can, of course, also comprise processing steps other than the steps described.

In a further embodiment of the invention, as represented in FIG. 5, the hub part 13 possesses flange-extensions 27, onto which the suction tables 1 to 4 are flanged. These flange-extensions 27 extend radially from the peripheral surface of the cylindrical hub part 13, and run, for example, parallel to the hub axis over the entire length of the hub part. It is also possible for the flange-extensions 27 to be of a shorter design, and to extend, in each case, only in the vicinity of the two end faces of the hub part 13.

Figure 6:
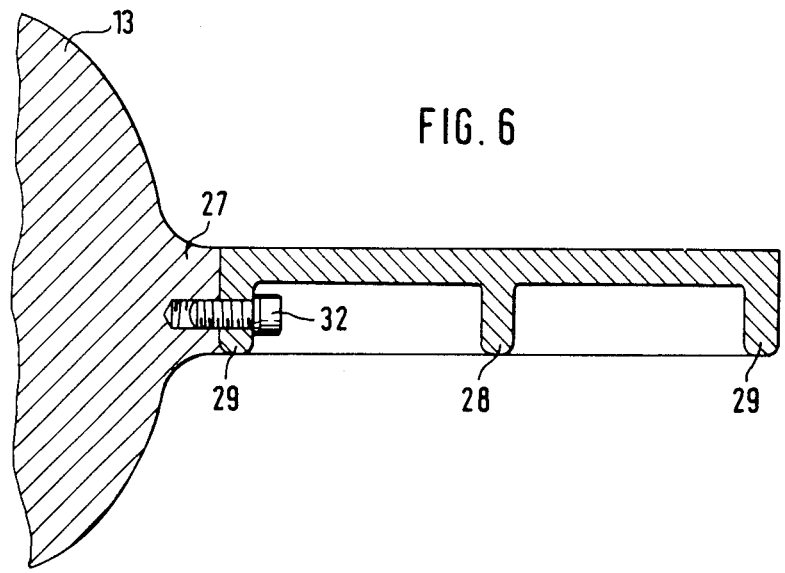
FIG. 6 is a detailed cross-sectional view of a flange extension, with a single suction table flanged thereon.
Figure 7:
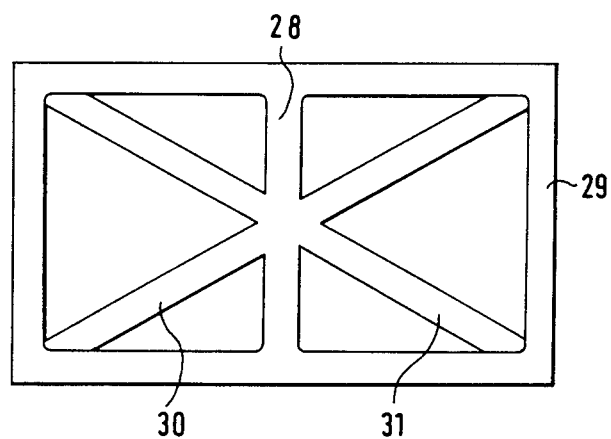
FIG. 7 is a bottom view of the suction table according to FIG. 6.

On their underside, the individual suction tables 1 to 4 (see FIG. 7) have a circumferential flange 29, and a centrally located web 28. At the same time, the flange 29 forms an edge of the suction table and, together with the web 28 and the diagonal cross-members 30 and 31, serves to stiffen the suction table. Holes are present in that portion of the flange 29 which is flanged onto the hub part 13, these holes being aligned with corresponding holes in the flange-extension 27 of the hub part 13. These holes possess internal threads which enable the suction table to be screwed by means of screws 32 to the flange-extension 27 of the hub part 13, as shown in FIG. 6.

As can be seen from FIG. 8, each suction table 1 to 4 is equipped with drive rollers 33, which are set obliquely to the transport direction of the printing plate 19 and are located in openings 36 in the supporting plane of the suction table. In FIG. 5, these drive rollers 33 are lowered beneath the level of the supporting plane of the suction table 1 and, as soon as the front edge of the printing plate 19 comes onto the suction table 1, they are raised above the level of the supporting plane, in order to effect the transport of the printing plate 19 on the supporting plane. Stop-pins 34 are located near one longitudinal edge of the suction table 1, these stop-pins likewise being capable of being lowered into the suction table 1 and extended from this table. As soon as the printing plate 19 comes onto the suction table 1, the stop-pins 34 are extended. An additional stop-pin 34 is provided near that edge of the suction table 1 which runs at right angles to the transport direction. It is self-explanatory that more than two stop-pins can be present in the longitudinal direction, or transport direction of the printing plate 19, and that two or more stop-pins 34 can also be present in the direction at right angles to the transport direction. The drive rollers 33 move the printing plate 19 until it comes to rest against the extended stoppins 34. When the edges of the plate rest against the extended stop-pins 34, they are detected by sensors 35 which switch off the drive to the drive rollers 33, lower the stop-pins 34 and the drive rollers 33, and switch on the vacuum for the suction table 1, so that the printing plate is held by suction above the suction slots 8, 8', 8'', . . . . The sensors 35 are arranged in such a manner that their centerline, which is drawn as a broken line in FIG. 8, is approximately tangential to the insides of the stop-pins 34.

In the position of the turnstile arrangement 12 shown in FIG. 5, the printing plate 19 is, for example, transported onto the suction table 1 in the direction of the arrow D. As soon as the printing plate 19 is positioned on the supporting plane of the suction table 1 by the stop-pins 34, in interaction with the drive rollers 33, the operation of drawing the printing plate by suction into contact is effected. After this operation has ended, the operation of electrostatically charging the printing plate 19 is carried out by means of a corona-type device 24, which is moved over the printing plate 19 in the direction of the double arrow A. As soon as the corona-type device 24 has returned again to its starting position, the turnstile arrangement 12 is rotated through 90° by the motor 14, which is controlled appropriately so that the suction table 1 together with the printing plate 19 assumes a vertical position in the plane II. In this position, the exposure of the printing plate 19 is effected by means of a light source 25 which, for example, irradiates a transparent original (not shown) and projects its image onto the charged printing plate 19.

In the embodiment shown in FIG. 1, positioning is effected in the same manner.

Since four printing plates are processed simultaneously by means of the suction device and each individual printing plate passes through a different step than the remaining three printing plates after each 90° rotation of the turnstile arrangement 12, it is obvious that accurate positioning of each individual printing plate 19 at the same point is necessary in every case in order to guarantee that the quality of the exposed and developed printing plates remains constant. A high flexiblity and a wide range of applications are conferred on the suction device as a result of the possiblity of selecting the dimensions of the suction tables in accordance with the formats of the printing plates which are to be processed, and as a result of the ability to flange the suction tables onto the hub part without major effort.

What is claimed is:

1. A suction device for securely holding plates in a processing position by sub-atmospheric pressure and for transporting the plates through a plurality of processing stations, comprising:

a turnstile arrangement comprising four suction tables which are located in pairs in two mutually perpendicular planes and which extend outwardly from the periphery of a central hub part, wherein each of said four suction tables comprises a plurality of suction slots on the surface thereof;

a vacuum source;

means, including a plurality of suction chambers connected to said suction slots by means of suction passages wherein each of said suction tables has a corresponding suction chamber, for providing a sub-atmospheric pressure through said suction chambers to said suction slots in such a manner that said sub-atmospheric pressure originates with the center slots and progresses in a successive manner to the outer edge slots, in order to provide sufficient pressure to completely lay flat the plates being processed, and wherein each of said suction chambers further comprises a piston which is shiftable from a starting position in said chamber, at which no vacuum is introduced, in a direction away from said pressure source to a final limiting position;

means for shifting each of said pistons between said starting and final positions; and a stepping motor connected to said hub part for rotating said turnstile arrangement through 90° steps, said rotation occurring when said piston reaches said final limiting position.

2. A suction device as claimed in claim 1, wherein said suction slots of each of said suction tables are connected in pairs to communicate with each other, wherein the slots comprising said pairs of slots are grouped, starting with the two central slots and progressing successively outwardly, to include the slots adjacent to the next more centrally paired slots.

3. A suction device as claimed in claim 2, wherein each pair of said communicating suction slots is connected by means of a common suction passage to said associated suction chamber.

4. A suction device as claimed in claim 5, wherein said piston shifting means progressively shifts its associated piston past each of said suction passages, opening said suction passages in a stepwise manner to said vacuum source.

5. A suction device as claimed in claim 4, wherein the first of said passages to be opened in said pressure source is connected to the most central of said pair of slots, and the remaining order of opening corresponds to a progression of introducing sub-atmospheric pressure to said pairs of slots from the center to the outer edge of said tables.

6. A suction device as claimed in claim 1, wherein each of said pistons further comprises a piston rod which leads out of the end face of said hub part furthermost from said pressure source, and a circular plate located on the free end of each of said piston rods to define a cam follower.

7. A suction device as claimed in claim 6, further comprising a radial stationary cam plate for engaging said circular plates of said pistons in said limiting position.

8. A suction device as claimed in claim 7, wherein said circular plates engage against a portion of the outside surface and against the inner edge of said cam plate during rotary movement of the turnstile arrangement.

9. A suction device as claimed in claim 8, further comprising a grab device for engaging said circular plates of said pistons and moving said pistons from said starting position to said final limiting position.

10. A suction device as claimed in claim 9, wherein said cam plate includes a cut-out section and said grab device engages said circular plate through said cut-out section.

11. A suction device as claimed in claim 1, wherein said tables are connected to said central hub part by means of flanges.

12. A suction device as claimed in claim 11, wherein said hub part comprises a plurality of flange extensions corresponding to the number of said tables for connecting said tables to said hub part.

13. A suction device as claimed in claim 11, wherein the dimensions of said tables are varied corresponding to the dimensions of the plates to be processed.

14. A suction device as claimed in claim 1 or 11, wherein each of said suction tables comprises a plurality of drive rollers for transporting the plates onto said suction tables, said rollers being positioned obliquely to the transport direction of the plates.

15. A suction device as claimed in claim 14, further comprising means for raising said rollers above and lowering them below the level of the supporting plane of said suction tables.

16. A suction device as claimed in claim 14, wherein each of said tables further comprises retractable stop pins arranged in the transport direction of the plates, near one longitudinal edge of said tables, and at right angles to the transport direction.

17. A suction device as claimed in claim 16, wherein each of said tables further comprises sensors in the supporting plane of said tables for detecting the edges of said plates bearing against said extended stop pins, for switching off said drive rollers and for lowering said stop pins and said drive rollers.

* * * * *

UNITED STATES PATENT AND TRADEMARK OFFICE
CERTIFICATE OF CORRECTION

PATENT NO. : 4,491,313
DATED : Jan. 1, 1985
INVENTOR(S) : Klaus-Peter SCHOEN

It is certified that error appears in the above—identified patent and that said Letters Patent is hereby corrected as shown below:

Column 9, line 10 (Claim 4): "Claim 5" should read -- Claim 1 --.

Signed and Sealed this

Twenty-eighth Day of May 1985

[SEAL]

Attest:

DONALD J. QUIGG

*Attesting Officer*     *Acting Commissioner of Patents and Trademarks*